United States Patent
Hsu et al.

(10) Patent No.: US 9,793,170 B2
(45) Date of Patent: Oct. 17, 2017

(54) SEMICONDUCTOR DEVICE AND FABRICATION METHOD THEREOF

(71) Applicant: UNITED MICROELECTRONICS CORP., Hsin-Chu (TW)

(72) Inventors: Chia Chang Hsu, Kaohsiung (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/856,573

(22) Filed: Sep. 17, 2015

(65) Prior Publication Data

US 2017/0062339 A1    Mar. 2, 2017

(30) Foreign Application Priority Data

Sep. 1, 2015  (TW) .............................. 104128778 A

(51) Int. Cl.
| | | |
|---|---|---|
| H01L 21/8234 | (2006.01) |
| H01L 27/088 | (2006.01) |
| H01L 29/66 | (2006.01) |
| H01L 21/768 | (2006.01) |
| H01L 21/28 | (2006.01) |
| H01L 23/485 | (2006.01) |
| H01L 23/532 | (2006.01) |

(52) U.S. Cl.
CPC ................ *H01L 21/823475* (2013.01); *H01L 21/28088* (2013.01); *H01L 21/76805* (2013.01); *H01L 21/76843* (2013.01); *H01L 21/76895* (2013.01); *H01L 23/485* (2013.01); *H01L 27/088* (2013.01); *H01L 29/66545* (2013.01); *H01L 23/53266* (2013.01)

(58) Field of Classification Search
CPC ......... H01L 21/823475; H01L 29/6656; H01L 21/823468; H01L 21/823864
See application file for complete search history.

(56) References Cited

U.S. PATENT DOCUMENTS

| | | | |
|---|---|---|---|
| 8,791,528 B2 | 7/2014 | Lin | |
| 2008/0217788 A1* | 9/2008 | Yang | H01L 21/76801 257/774 |
| 2011/0272765 A1* | 11/2011 | Seo | H01L 23/485 257/410 |
| 2014/0042502 A1* | 2/2014 | Xie | H01L 29/78 257/288 |
| 2016/0118303 A1* | 4/2016 | Kuo | H01L 29/66636 257/368 |

* cited by examiner

*Primary Examiner* — Peniel M Gumedzoe
*Assistant Examiner* — Christopher Johnson
(74) *Attorney, Agent, or Firm* — Winston Hsu

(57) ABSTRACT

A semiconductor device includes a substrate, a first gate structure on the substrate, a first spacer adjacent to the first gate structure, a lower contact plug adjacent to the first gate structure and contact the first spacer, and a first overhang feature disposed on an upper end of the first spacer.

12 Claims, 5 Drawing Sheets

SEMICONDUCTOR DEVICE AND FABRICATION METHOD THEREOF

CROSS REFERENCE TO RELATED APPLICATION

This application claims the benefit of Taiwan patent application No. 104128778, filed on Sep. 1, 2015, the disclosure of which is incorporated herein in its entirety by reference.

BACKGROUND OF THE INVENTION

1. Field of the Invention

The present invention relates generally to a semiconductor device and, more particularly, to a low-resistance contact structure and a method of making the same.

2. Description of the Prior Art

As the size of the integrated circuit devices continues to scale down, the polysilicon gate and the silicon dioxide insulating layer of a metal-oxide-semiconductor field effect transistor (MOSFET) structure have been confronted with the physical limits of the material itself. To meet the demands of scalability, it is necessary to incorporate high-k metal gate (HK/MG) process.

Today, two main integration options remain: gate-first (often referred to as MIPS, metal inserted poly-silicon) and gate-last (also called RMG, replacement metal gate). The terminology "first" and "last" refers to whether the metal electrode is deposited before or after the high temperature activation anneal of the flow. The replacement metal gate (RMG) process flow allows the use of aluminum as a conductor material.

Typically, the $M_0$ contact is fabricated after the RMG process. Currently, a so-called Self-Aligned Contact (SAC) is employed. However, this technical field still encounters some problems even after the SAC technique and metal gate scheme are introduced.

For example, as the gap between the gate structures is less than a certain dimension, e.g., 10 nm, the SAC structure manufactured by existing processes may not satisfy the electrical requirements. Process misalignment leads to laterally offset of the SAC structure. When the SAC structure deviates from a predetermined position, the contact area between the SAC structure and the active region below will be reduced, resulting in significant increase of contact resistance (Rc).

SUMMARY OF THE INVENTION

The present invention proposes a low-resistance contact structure and its manufacturing method that is compatible with replacement metal gate (RMG) processes, thereby solving the above-mentioned shortcomings and disadvantages of the prior art.

According to one embodiment of the invention, a semiconductor device includes a substrate, a first gate structure on the substrate, a first spacer adjacent to the first gate structure, a lower contact plug adjacent to the first gate structure, and a first overhang feature disposed on an upper end of the first spacer.

According to one embodiment of the invention, the semiconductor device further includes a second gate structure on the substrate, a second spacer adjacent to the second gate structure, and a second overhang feature disposed on an upper end of the second spacer. The lower contact plug is situated between the first gate structure and the second gate structure. The lower contact plug contacts the first spacer and the second spacer. The lower contact plug has a bottle-shaped profile between the first spacer and the second spacer.

According to one embodiment of the invention, the semiconductor device further includes an interlayer dielectric (ILD) layer on the first gate structure, the second gate structure, the first overhang feature, and the second overhang feature, and at least an upper contact plug in the ILD layer and directly above the lower contact plug. The upper contact plug is electrically connected to the lower contact plug.

According to one embodiment of the invention, a method for fabricating a semiconductor device is provided. A substrate having a dummy gate thereon is prepared. A spacer is disposed on a sidewall of the dummy gate. A source/drain region is disposed adjacent to the dummy gate. A sacrificial layer is then formed on the source/drain region. A cap layer is then formed on the sacrificial layer. A top surface of the cap layer is coplanar with a top surface of the dummy gate. A replacement metal gate (RMG) process is performed to transform the dummy gate into a replacement metal gate. An opening is then formed in the cap layer to expose a top surface of the sacrificial layer. The sacrificial layer is removed through the opening, thereby forming a lower contact hole exposing a top surface of the source/drain region. A lower contact plug is then formed in the lower contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

In the following detailed description, reference is made to the accompanying drawings, which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention. The following detailed description is, therefore, not to be taken in a limiting sense, and the scope of the present invention is defined by the appended claims, along with the full scope of equivalents to which such claims are entitled.

Briefly, the present invention pertains to a method of fabricating a contact plug or contact structure, which involves the replacement metal gate (RMG) process. Prior to the RMG process, a dummy amorphous silicon (dummy a-Si) layer is buried into a gap between gate structures. The dummy a-Si layer is then covered with a HDP oxide layer. After the RMG process, an $M_0$ contact replacement process for forming the contact structure is performed. The dummy a-Si layer buried in the gap between gate structures is replaced with a metal layer, thereby forming a low-resistance $M_0$ contact structure.

Figure 1:
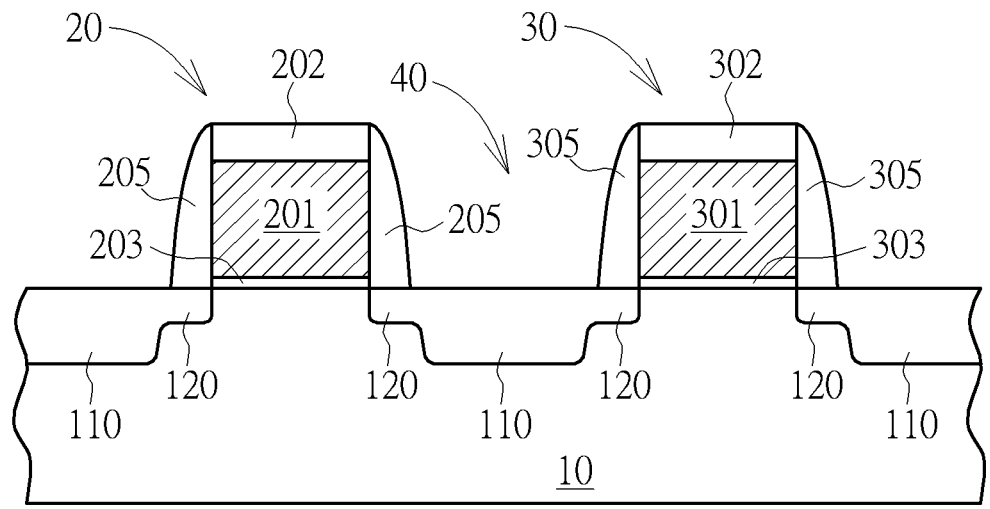
FIG. 1 to FIG. 8 are schematic, cross-sectional diagrams showing an exemplary method of fabricating a contact structure in accordance with one embodiment of the invention.

Please refer to FIG. 1 to FIG. 8. FIG. 1 to FIG. 8 are schematic, cross-sectional diagrams showing an exemplary method of fabricating a contact structure in accordance with one embodiment of the invention. First, as shown in FIG. 1, a substrate 10 is provided. For example, the substrate 10 may comprise a semiconductor substrate or a silicon substrate, but not limited thereto. According to one embodiment of the invention, the substrate 10 may comprise a plurality of fin structures (not explicitly shown).

Subsequently, at least two adjacent dummy gate structures 20 and 30 are formed on a main surface of the substrate 10. According to one embodiment of the invention, the dummy gate structure 20 comprises at least a sacrificial layer 201 and a cap layer 202. For example, the sacrificial layer 201 may comprise amorphous silicon or polysilicon, and the cap layer 202 may comprise silicon nitride, but not limited thereto. A gate dielectric layer 203 may be disposed between the sacrificial layer 201 and the substrate 10. A gate dielectric layer 303 may be disposed between the sacrificial 301 and the substrate 10. The gate dielectric layers 203, 303 may comprise, for example, silicon dioxide, but not limited thereto.

According to one embodiment of the invention, the two adjacent dummy gate structures 20 and 30 may be straight-line shaped and parallel to each other. According to one embodiment of the invention, the two adjacent dummy gate structures 20 and 30 may traverse the fin structures (not explicitly shown) of the substrate 10.

According to one embodiment of the invention, at least one spacer 205, for example, a silicon nitride spacer, may be formed on either sidewall of the dummy gate structure 20, but not limited thereto. At least one spacer 305, for example, a silicon nitride spacer, may be formed on either sidewall of the dummy gate structure 30, but not limited thereto.

According to one embodiment of the invention, a conductive region 110, for example, a heavily doped source/drain region, may be disposed in the substrate 10, but not limited thereto. According to one embodiment of the invention, the conductive region 110 may comprise an epitaxial layer (not explicitly shown), for example, SiGe epitaxial layer or SiP epitaxial layer, but not limited thereto. According to one embodiment of the invention, a lightly doped drain (LDD) region 120 may be disposed in the substrate 10. The LDD region 120 may be disposed directly under the spacer 205 or spacer 305.

Optionally, according to one embodiment of the invention, a contact etch stop layer (not shown) such as a silicon nitride thin film may be conformally formed on the dummy gate structures 20, 30 and the conductive region 110.

According to one embodiment of the invention, a gap 40 is formed between the two adjacent dummy gate structures 20 and 30. A top surface of the conductive region 110 is exposed at the bottom of the gap 40. As previously mentioned, the gap 40 continues to shrink with advances in the semiconductor technology. Therefore, the surface area of the conductive region 110 exposed at the bottom of the gap 40 becomes smaller and smaller. For the 14 nm technology nodes or beyond, even very slight shift of the self-aligned contact may lead to significant increase of contact resistance (Rc). The present invention addresses this issue.

Figure 2:
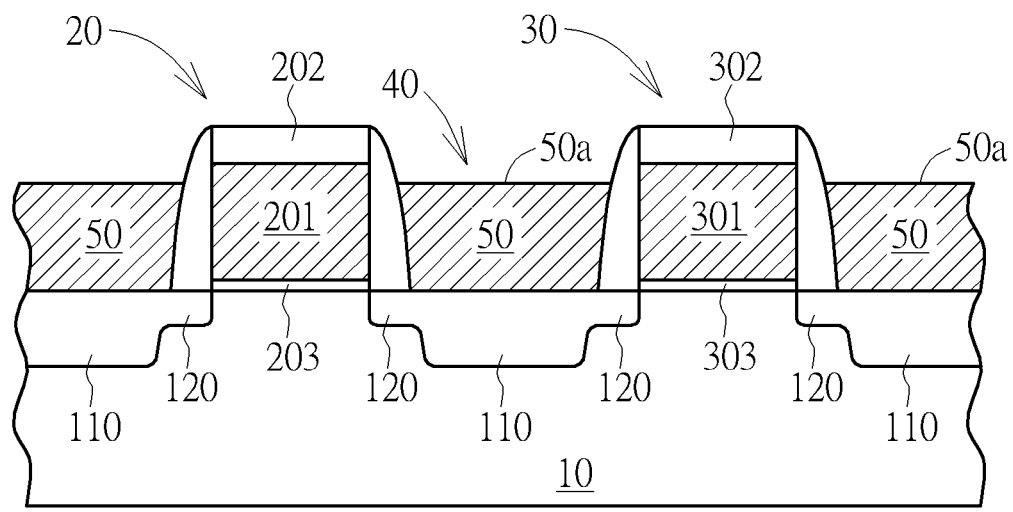

As shown in FIG. 2, according to one embodiment of the invention, a sacrificial layer 50 is deposited into the gap 40. The sacrificial layer 50 may comprise amorphous silicon (a-Si), but not limited thereto. The sacrificial layer 50 has a top surface 50a that is lower than top surfaces of the dummy gate structures 20 and 30. To form the sacrificial layer 50, for example, a chemical vapor deposition (CVD) process is performed to deposit a material layer such as an amorphous silicon layer in a blanket manner. The material layer completely fills up the gap 40. A chemical mechanical polishing (CMP) process or an etching back process is then carried out to remove a portion of the material layer. A portion of the material layer is left within the gap 40, thereby forming the sacrificial layer 50.

Figure 3:
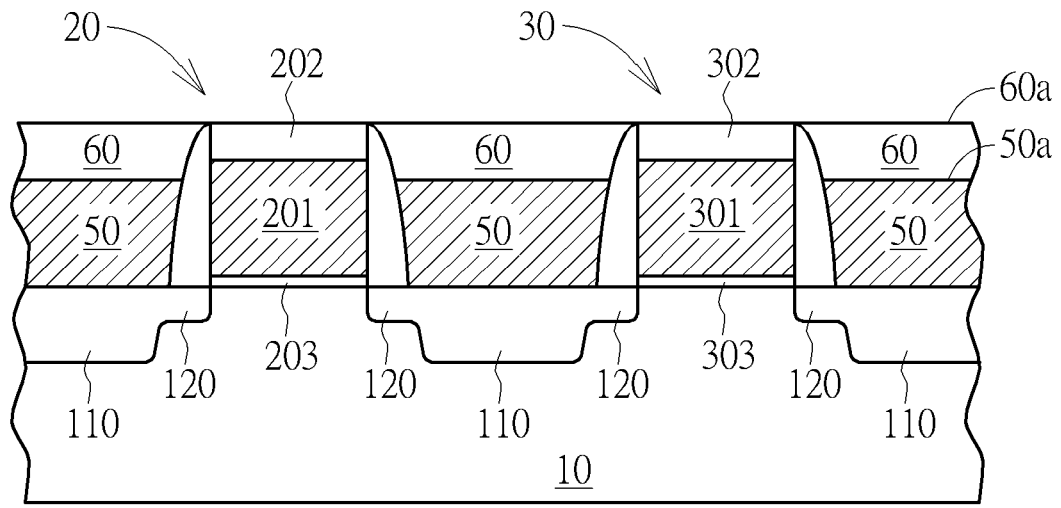

As shown in FIG. 3, the sacrificial layer 50 is covered with a cap layer 60, for example, a high-density plasma (HDP) oxide layer. The cap layer 60 and the sacrificial layer 50 together fill up the gap 40. According to one embodiment of the invention, to form the cap layer 60, for example, a high-density plasma CVD (HDPCVD) process is performed to deposit an HDP oxide in a blanket manner. The HDP oxide layer covers the dummy gate structures 20 and 30, and fills into the gap 40 to thereby cover the sacrificial layer 50. A CMP process is performed to remove a portion of the HDP oxide layer until the cap layers 202 and 302 of the dummy gate structures 20 and 30 are revealed. The remaining portion of the HDP oxide layer is left in the gap 40.

Figure 4:
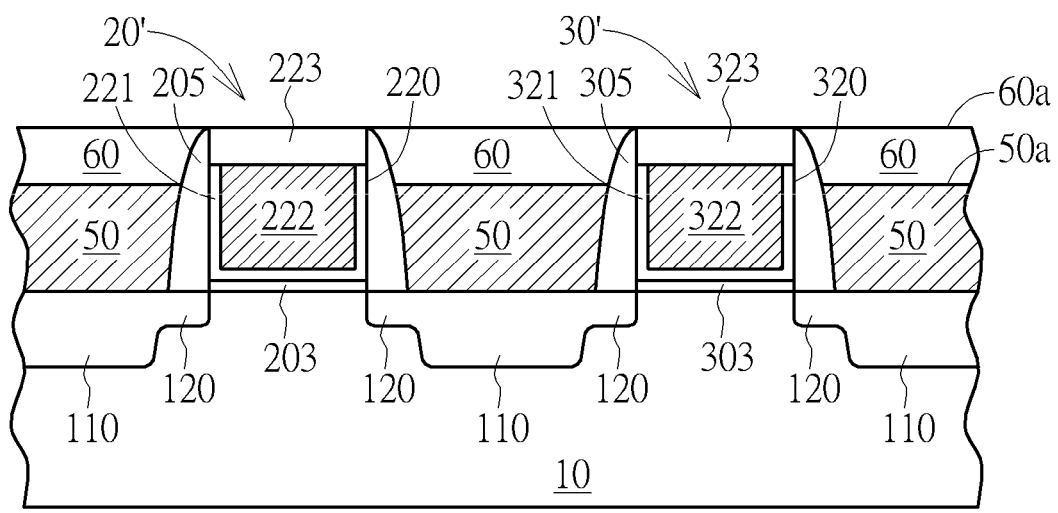

As shown in FIG. 4, subsequently, a replacement metal gate (RMG) process is performed. For example, the dummy gate structures 20 and 30 including the sacrificial layers 201, 301 and the cap layers 202, 302 are removed, thereby forming gate trenches 220 and 320. Thereafter, high-k dielectric layer 221, 321, replacement metal gates 222, 322, and cap layers 223, 323 are formed within the gate trenches 220, 320, respectively, to thereby form replacement gate structures 20' and 30'.

According to one embodiment of the invention, for example, the high-k dielectric layers 221, 321 may be composed of a material selected from the group including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

According to one embodiment of the invention, for example, the replacement metal gate 222, 322 may be multi-layer structure and may comprise, from bottom to top, a bottom barrier layer, a metal layer with desired work function, a top barrier layer and a main conducting layer. The bottom barrier layer may comprise a single or composite layer comprising tantalum nitride (TaN) or titanium nitride (TiN), etc. The metal layer may comprise a single or a composite layer with desired work function, which meets the transistor's requirement. The metal layer may be composed of a material selected from the group including titanium nitride (TiN), titanium carbide (TiC), tantalum nitride (TaN), tantalum carbide (TaC), tungsten carbide (WC), titanium aluminide (TiAl), aluminum titanium nitride (TiAlN), etc. The top barrier layer may comprise a single or composite layer comprising tantalum nitride (TaN) or titanium nitride (TiN), etc. The main conducting layer may comprise aluminum, tungsten, titanium aluminum alloy (TiAl), cobalt tungsten phosphide (CoWP), or other materials with low resistance.

According to one embodiment of the invention, the cap layers 223, 323 may comprise, for example, silicon nitride, but not limited thereto. At this point, the cap layers 223, 323 may have top surfaces that are flush with a top surface 60a of the cap layer 60. Alternatively, the top surface 60a of the cap layer 60 may be slightly lower than the top surfaces of the cap layers 223, 323.

Figure 5:
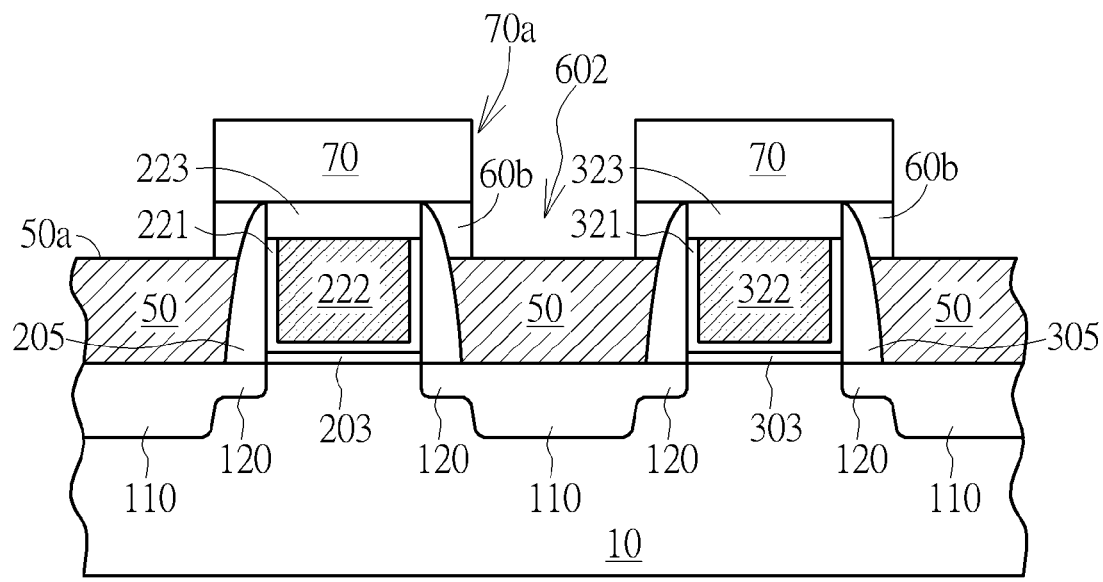

As shown in FIG. 5, after the RMG process, a photoresist (or etching resist) pattern 70 is formed on the top surface 60a of the cap layer 60 and the top surfaces of the cap layers 223, 323. The photoresist pattern 70 includes an opening 70a that exposes a portion of the top surface 60a of the cap layer 60. The opening 70a may be located directly above the conductive region 110. According to one embodiment of the invention, the opening 70a may have a width that is smaller than a width of the conductive region 110, but not limited thereto. Subsequently, an etching process is performed to etch the cap layer 60 through the opening 70a, thereby forming an opening 602 in the cap layer 60. The opening 602 exposes a portion of the top surface 50a of the sacrificial layer 50. Thereafter, the photoresist pattern 70 is removed.

According to one embodiment of the invention, the remaining cap layers 60 situated on the upper ends of the spacers 205, 305 constitute overhang features 60b. The overhang features 60b may compensate the inadequate thickness at the upper ends of the spacers 205, 305, thereby improving the electrical performance.

Figure 6:
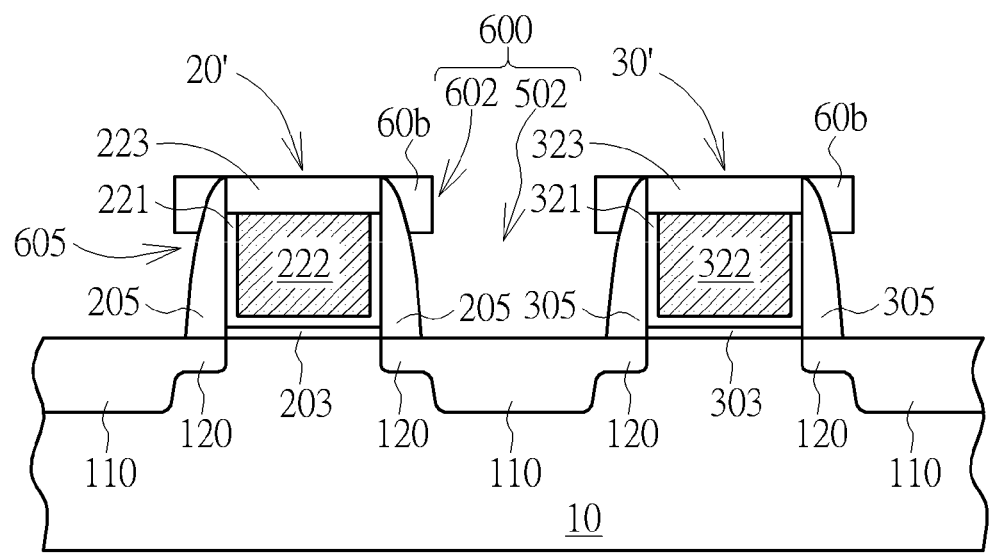

As shown in FIG. 6, an etching process such as a wet etching process is performed to selectively etch away the sacrificial layer 50 through the opening 602, thereby forming a widened opening 502 under the opening 602. The widened opening 502 exposes the lower surfaces of the spacers 205, 305 under the overhang features 60b, and reveals the entire surface of the conductive region 110. According to one embodiment of the invention, the opening 602 and the widened opening 502 constitute a bottle-shaped opening (or lower contact hole) 600. At this point, an undercut 605 is formed between the overhang features 60b and the spacers 205, 305.

According to one embodiment of the invention, if a contact etch stop layer (not shown) such as a silicon nitride layer is formed on the spacers 205, 305 and the conductive region 110, another etching process may be performed after etching the sacrificial layer 50 to remove the contact etch stop layer from the conductive region 110.

Figure 7:
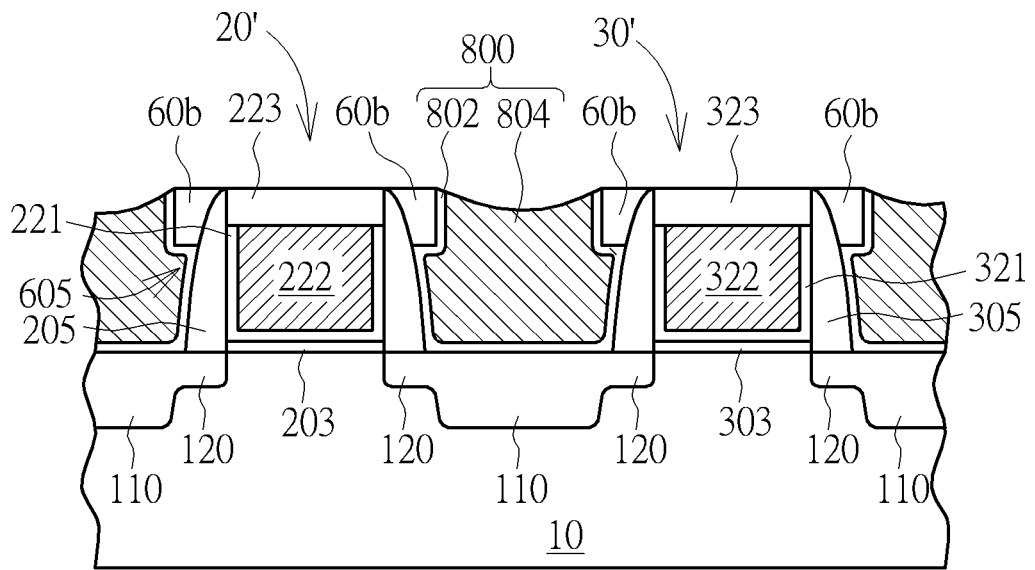

As shown in FIG. 7, subsequently, a CVD process such as atomic layer deposition (ALD) or the like may be performed to conformally deposit a glue layer 802 on the interior surface of the opening 600, including the surfaces of the overhang features 60b and the spacers 205, 305, and the surface of the conductive region 110. According to one embodiment of the invention, the glue layer 802 may include, but not limited to, titanium (Ti) or titanium nitride (TiN). According to one embodiment of the invention, the glue layer 802 may be deposited outside the opening 600, for example, the top surfaces of the cap layers 223, 323.

Subsequently, another deposition process is performed to form a low-resistance conductive layer 804, for example, tungsten (W) layer, on the glue layer 802. According to one embodiment of the invention, the low-resistance conductive layer 804 fills up the opening 600. A chemical mechanical polishing (CMP) process is performed to remove the glue layer 802 and the low-resistance conductive layer 804 outside the opening 600. The remaining glue layer 802 and the low-resistance conductive layer 804 inside the opening 600 constitute a lower contact plug 800. According to one embodiment of the invention, the lower contact plug 800 has a shape that conforms to the bottle-shape of the opening 600. The lower contact plug 800 has a narrower top portion and a wider bottom portion.

Figure 8:
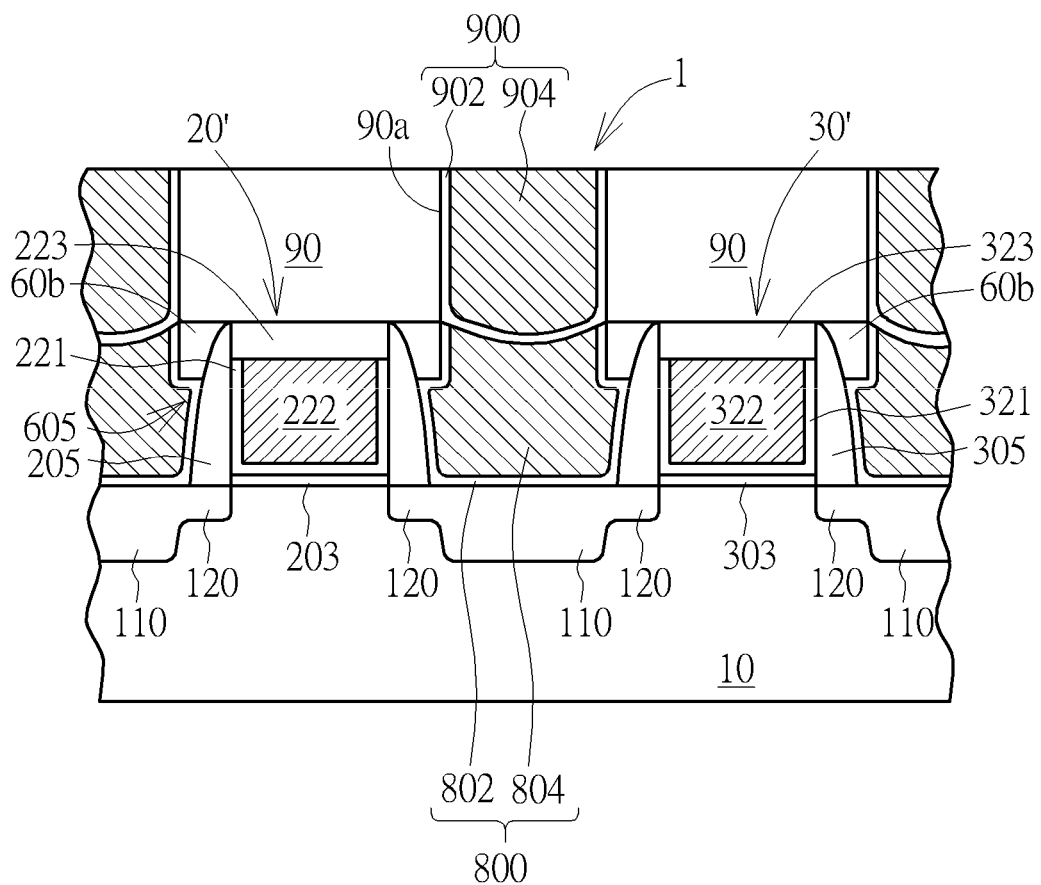

As shown in FIG. 8, subsequently, an inter-layer dielectric (ILD) layer 90 such as a silicon oxide layer is deposited in a blanket manner. The ILD layer 90 covers the lower contact plug 800 and the cap layers 223, 323. Subsequently, lithographic and etching processes are performed to form an opening (or upper contact hole) 90a in the ILD layer 90. The opening 90a may be located directly above the lower contact plug 800 and expose a top surface of the lower contact plug 800.

Subsequently, a CVD process such as ALD process or other suitable deposition processes may be performed to conformally deposit a glue layer 902 on the interior surface of the opening 90a and on the surface of the ILD layer 90. According to one embodiment of the invention, the glue layer 902 may include, but not limited to, Ti or TiN. Another deposition process is then performed to form a low-resistance conductive layer 904 such as tungsten layer on the glue layer 902. According to one embodiment of the invention, the opening 90a is filled up with the low-resistance conductive layer 904. A CMP process may be performed to remove the glue layer 902 and the low-resistance conductive layer 904 outside the opening 90a. The remaining glue layer 902 and the low-resistance conductive layer 904 inside the opening 90a constitute an upper contact plug 900. The upper contact plug 900 and the lower contact plug constitute the present invention low-resistance contact structure.

Structurally, as shown in FIG. 8, one embodiment of the invention discloses a semiconductor device 1 including a substrate 10, a first gate structure 20' on the substrate 10, a first spacer 205 adjacent to the first gate structure 20', a lower contact plug 800 adjacent to the first gate structure 20' and contact the first spacer 205, and a first overhang feature 60b disposed on an upper end of the first spacer 205. An undercut structure 605 is located between the first overhang feature 60b and the first spacer 205. The lower contact plug 800 comprises a first tungsten layer and a first glue layer 802.

According to one embodiment of the invention, the semiconductor device 1 further includes a second gate structure 30' on the substrate 10, a second spacer 305 adjacent to the second gate structure 30', and a second overhang feature 60b disposed on an upper end of the second spacer 305. The lower contact plug 800 is situated between the first gate structure 20' and the second gate structure 30'. The lower contact plug 800 contacts the first spacer 205 and the second spacer 305. The lower contact plug 800 has a bottle-shaped profile between the first spacer 205 and the second spacer 305.

According to one embodiment of the invention, the semiconductor device 1 further includes an inter-layer dielectric (ILD) layer 90 covering the first gate structure 20', the second gate structure 30', the first overhang feature 60b, and the second overhang feature 60b, and at least an upper contact plug 900 in the ILD layer 90. The upper contact plug 900 is situated directly above the lower contact plug 800 and is electrically connected to the lower contact plug 800.

It is to be understood that the upper contact plug 900 may be formed directly on the first gate structure 20' or the second gate structure 30' to electrically connect to the first gate structure 20' or the second gate structure 30', which is not shown in this figure.

Figure 9:
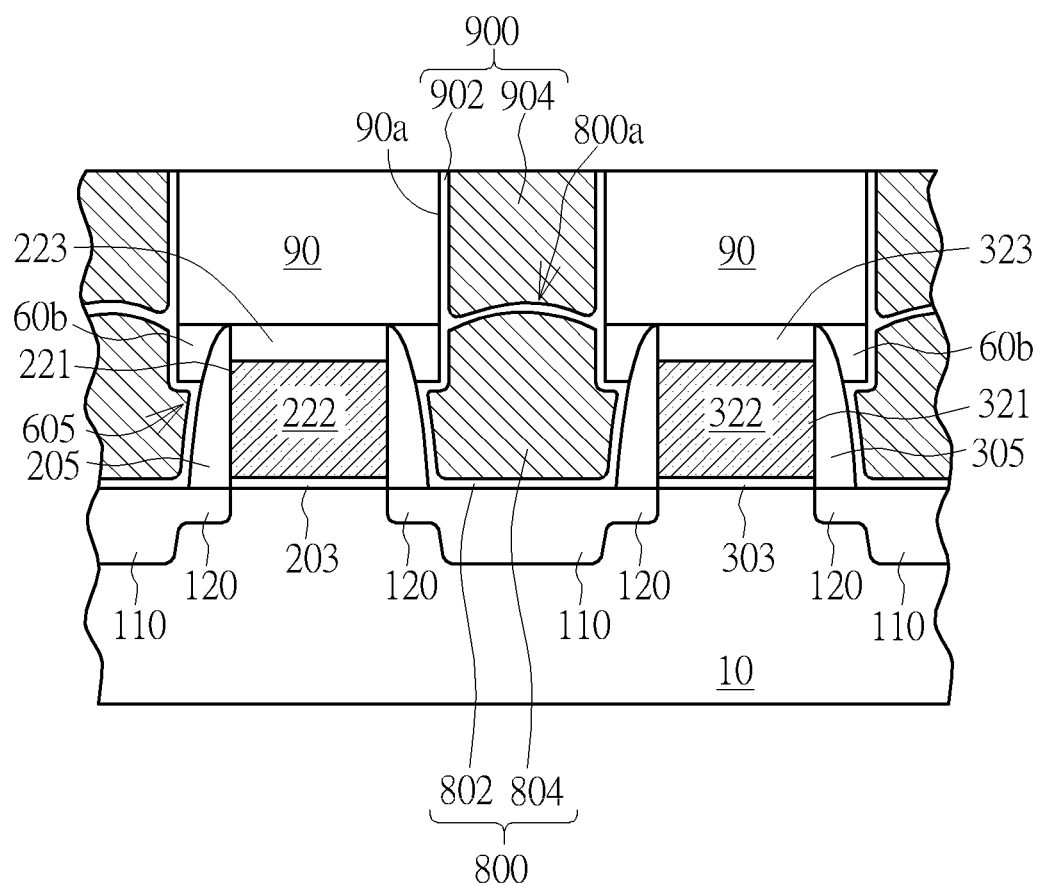
FIG. 9 is a schematic, cross-sectional diagram showing a contact structure in accordance with another embodiment of the invention.

FIG. 9 is a schematic, cross-sectional diagram showing a contact structure in accordance with another embodiment of the invention. As shown in FIG. 9, and briefly back to FIG. 6, after depositing the glue layer 802 and the low-resistance conductive layer 804 inside the opening 600, a CMP process is performed to remove the glue layer 802 and the low-resistance conductive layer 804 outside the opening 600. The remaining glue layer 802 and the low-resistance conductive layer 804 constitute the lower contact plug 800. By adjusting the parameters of the CMP process, a convex top surface 800a of the low-resistance conductive layer 804 is obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first gate structure on the substrate;
   a first spacer adjacent to the first gate structure;
   a lower contact plug adjacent to the first gate structure and contacting the first spacer;
   a first overhang feature disposed on the first spacer, wherein the first overhang feature is in direct contact with the first spacer only at an upper end of the first spacer, and a top surface of the first overhang feature is coplanar with a top surface of the first gate structure by having a polished surface thereof made by a chemical mechanical polishing (CMP) process; and
   an upper contact plug disposed directly above the lower contact plug, wherein a concave interface between the upper contact plug and the lower contact plug abuts the top surface of the first overhang feature.

2. The semiconductor device according to claim 1, wherein the lower contact plug comprises a first tungsten layer and a first glue layer.

3. The semiconductor device according to claim 2, wherein the first glue layer is disposed between the first tungsten layer and the first spacer.

4. The semiconductor device according to claim 2, wherein the first glue layer is disposed between the first tungsten layer and the first overhang feature.

5. The semiconductor device according to claim 2, wherein the first glue layer comprises Ti or TiN.

6. The semiconductor device according to claim 1, wherein the first overhang feature comprises silicon oxide.

7. The semiconductor device according to claim 1, wherein the lower contact plug comprises a narrower top portion and a wider bottom portion.

8. The semiconductor device according to claim 7 further comprising an undercut between the first overhang feature and the first spacer, wherein the wider bottom portion is disposed within the undercut.

9. The semiconductor device according to claim 1 further comprising:
   a second gate structure on the substrate;
   a second spacer adjacent to the second gate structure; and
   a second overhang feature only disposed on an upper end of the second spacer;
   wherein the lower contact plug is situated between the first gate structure and the second gate structure, wherein the lower contact plug contacts the first spacer and the second spacer, wherein the lower contact plug has a bottle-shaped profile with a narrower top portion and a wider bottom portion between the first spacer and the second spacer.

10. The semiconductor device according to claim 9, wherein the upper contact plug is formed in an interlayer dielectric (ILD) layer disposed on the first gate structure, the second gate structure, the first overhang feature and the second overhang feature, wherein the upper contact plug is electrically connected to the lower contact plug.

11. The semiconductor device according to claim 10 further comprising:
   a second glue layer between the upper contact plug and the lower contact plug.

12. The semiconductor device according to claim 11, wherein the second glue layer comprise Ti or TiN.

* * * * *